United States Patent
Lee et al.

(10) Patent No.: US 8,803,251 B2
(45) Date of Patent: Aug. 12, 2014

(54) TERMINATION OF HIGH VOLTAGE (HV) DEVICES WITH NEW CONFIGURATIONS AND METHODS

(75) Inventors: Yeeheng Lee, San Jose, CA (US); Madhur Bobde, Sunnyvale, CA (US); Yongping Ding, Sunnyvale, CA (US); Jongoh Kim, Cupertino, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 13/135,982

(22) Filed: Jul. 19, 2011

(65) Prior Publication Data

US 2013/0020671 A1  Jan. 24, 2013

(51) Int. Cl.
*H01L 29/06* (2006.01)
*H01L 21/76* (2006.01)

(52) U.S. Cl.
USPC ........... 257/409; 257/339; 257/168; 257/487; 257/490

(58) Field of Classification Search
USPC ........... 257/490, 170, 409, 452, 484, 605, 257/E29.013, E23.012, 494, 495, 127, 483
See application file for complete search history.

(56) References Cited

U.S. PATENT DOCUMENTS

| | | | | |
|---|---|---|---|---|
| 6,462,376 B1* | 10/2002 | Wahl et al. | | 257/331 |
| 2002/0100935 A1* | 8/2002 | Inoue | | 257/341 |
| 2002/0125541 A1* | 9/2002 | Korec et al. | | 257/471 |
| 2006/0214242 A1* | 9/2006 | Carta et al. | | 257/409 |
| 2008/0001217 A1* | 1/2008 | Kawashima | | 257/330 |

* cited by examiner

*Primary Examiner* — Asok K Sarkar
*Assistant Examiner* — Dmitriy Yemelyanov
(74) *Attorney, Agent, or Firm* — Bo-In Lin

(57) ABSTRACT

This invention discloses a semiconductor power device disposed in a semiconductor substrate comprising a heavily doped region formed on a lightly doped region and having an active cell area and an edge termination area. The edge termination area comprises a plurality of termination trenches formed in the heavily doped region with the termination trenches lined with a dielectric layer and filled with a conductive material therein. The edge termination further includes a plurality of buried guard rings formed as doped regions in the lightly doped region of the semiconductor substrate immediately adjacent to the termination trenches.

5 Claims, 12 Drawing Sheets

TERMINATION OF HIGH VOLTAGE (HV) DEVICES WITH NEW CONFIGURATIONS AND METHODS

BACKGROUND OF THE INVENTION

1. Field of the Invention

The invention relates generally to the semiconductor power devices. More particularly, this invention relates to configurations and methods for manufacturing of new and improved edge terminations for high voltage (HV) devices for improved reliability and to reduce the areas occupied by the termination areas while maintaining high breakdown voltages.

2. Description of the Prior Art

Conventional floating guard rings in the termination area are not sufficient to sustain high breakdown voltages for high-voltage (HV) devices that have heavily doped N regions 110, e.g., doping concentration of $10^{16}$ dopants/cm$^3$, of about two to five microns in depth below the top surface of the substrate 105 as that shown in FIG. 1. The N-charge in the heavily doped region 110 is too high and the floating guard rings, which are P type doped regions implanted in the heavily doped N region, need charge compensation in order to sustain a higher breakdown voltage in the termination area. The conventional edge termination designs with voltage drop in the oxide lining the trench are not effective in resolving the problems due to the facts that such edge termination can only sustain a breakdown voltage up to approximately 100 volts. The lower breakdown voltage of approximately 100 volts is caused by the gross field crowding effects under the trench. The low breakdown voltage at the edge termination will limit the applications of the high-voltage (HV) devices when a higher voltage operational requirement is necessary.

Therefore, a need still exists in the art of power semiconductor device design and manufacture to provide new and improved configurations of the edge termination such that the above discussed problems and limitations can be resolved.

SUMMARY OF THE PRESENT INVENTION

It is therefore an aspect of the present invention to provide a new and improved edge termination configuration to reduce the electrical field crowding effects near the blocking junction at the device edge and provide a compact termination with lower surface electric field that is less sensitive to surface charge. This is achieved with the formation of a plurality of termination trenches formed in the heavily doped region and forming doped regions at the bottom of the termination trenches in the lightly doped region to function as buried guard rings in the edge termination.

Specifically, an aspect of this invention is to provide a new and improved edge termination configuration for a semiconductor power device by forming a plurality of buried guard rings either underneath or surrounding the areas around a plurality of termination trenches opened in the edge termination areas. Theoretically, the pinch-off of the floating guard rings limits the voltage drop across each mesa between two trenches. Therefore, an important aspect of the present invention is to design the mesa width and space increments between two trenches to achieve breakdown voltage suitable for application of high voltage devices while the buried guard rings result in low sensitivity to the surface charges.

It is another aspect of this invention to provide the new and improved edge termination configuration for a semiconductor power device by forming a plurality of termination trenches and forming the guard rings at the bottom and around the sidewalls of alternating trenches to overcome the potential issues of the shortening of the adjacent guard rings when the mesa doping is light. Every two guard rings are formed at the bottom of the two termination trenches with an intermediate termination trench not surrounded by a guard-ring doped region. The termination trenches with no guard ring doped region do not have the P-region along the sidewalls and can therefore sustain high breakdown voltage limited by the buried guard ring pinch-off.

Briefly in a preferred embodiment this invention discloses a semiconductor power device disposed in a semiconductor substrate and having an active cell area and an edge termination area. The edge termination area comprises a plurality of termination trenches lined with an insulation layer and filled with a gate material therein. The edge termination further includes a plurality of buried guard rings formed as doped regions in the semiconductor substrate immediately adjacent to the termination trenches. In an embodiment of this invention, the plurality of buried guard rings formed as doped regions in the semiconductor substrate immediately below a bottom surface of the termination trenches. In another embodiment, the plurality of buried guard rings formed as doped regions in the semiconductor substrate immediately below a bottom surface and surrounding a lower portion of the termination trenches. In another embodiment, the plurality of buried guard rings formed as doped regions in the semiconductor substrate immediately below a bottom surface and surrounding sidewalls of the termination trenches wherein the buried guard rings are disposed around alternate termination trenches with every two of the guard rings separated by a middle termination trench with no buried guard ring underneath.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1:
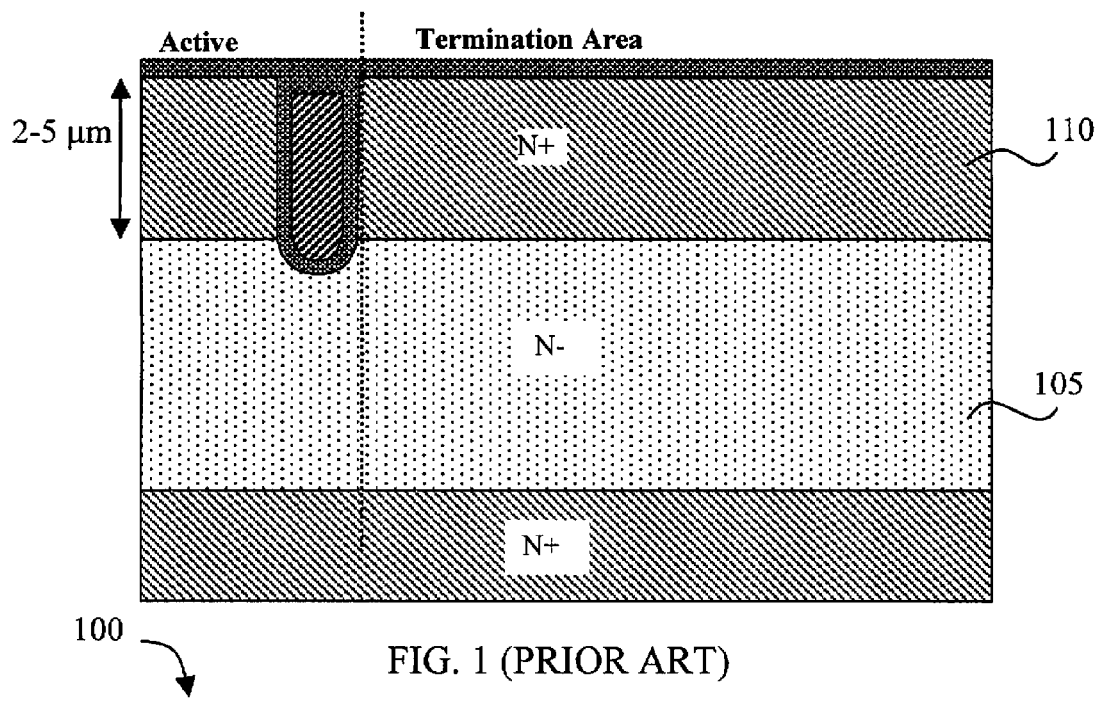
FIG. 1 is a cross sectional view showing a conventional edge termination configuration for a HV device structure.
Figure 2A:
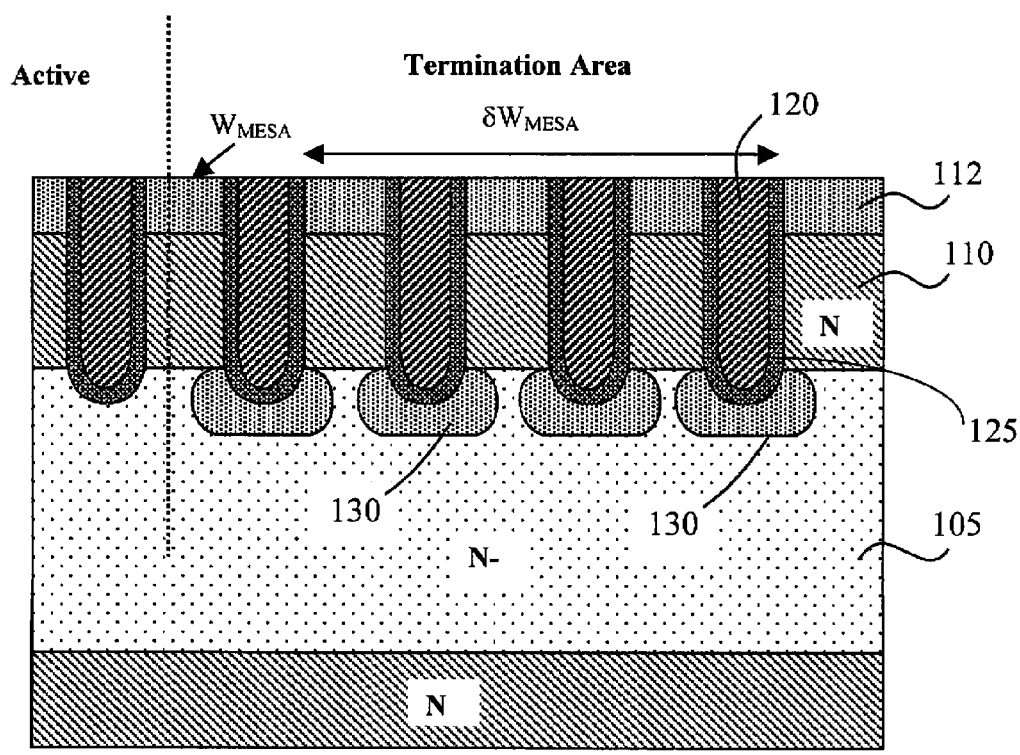
FIG. 2A is a cross sectional view for illustrating the configuration of an edge termination with buried guard rings of this invention for a high voltage (HV) device.

FIG. 2A is a cross sectional view for illustrating the configuration of an edge termination 100 with buried guard rings of this invention for a high voltage (HV) device that includes a heavily doped N region 110 formed on a lightly doped N-type substrate 105. A P-type body region 112 is also formed at the top of the heavily doped N region 110. The edge termination 100 includes a plurality of edge termination trenches 120 lined with a dielectric layer 125, e.g., oxide layer, on the sidewalls and bottom surface of the trenches and then filled with a conductive material, such as polysilicon. A buried guard ring doped P-type region 130 is formed in the substrate 105 immediately below the bottom surface of each of the edge termination trenches 120. The buried guard ring doped regions 130 are formed by implanting through the edge termination trenches 120 as will be further discussed below. The pinch-off of the buried guard rings 130 limits the voltage drop across the mesa regions, $W_{MESA}$, between the edge termination trenches. As such, the key design parameters to increase the breakdown voltage of the power device are the width of the mesa, $W_{MESA}$, and the spacing increments, $W_{MESA}$, between the trenches 120. The mesa width $W_{MESA}$ determines the guard ring spacing, since the guard rings are formed directly under the trenches using a topside implant. The guard ring spacing determines the pinch off voltage between them. The spacing is generally small for rings placed near the active are edge and should be increased as they go farther away. The parameter $W_{MESA}$ determines this gradient of guard ring spacing and is an important optimization parameter for termination. Since the buried guard rings are deep inside the substrate 105, the buried guard rings have a low sensitivity to the surface charge due to increased spacing. This makes this termination more tolerant to charges from passivation films and mold compounds that get displaced during High temperature Reverse Bias Reliability testing.

Figure 2B:
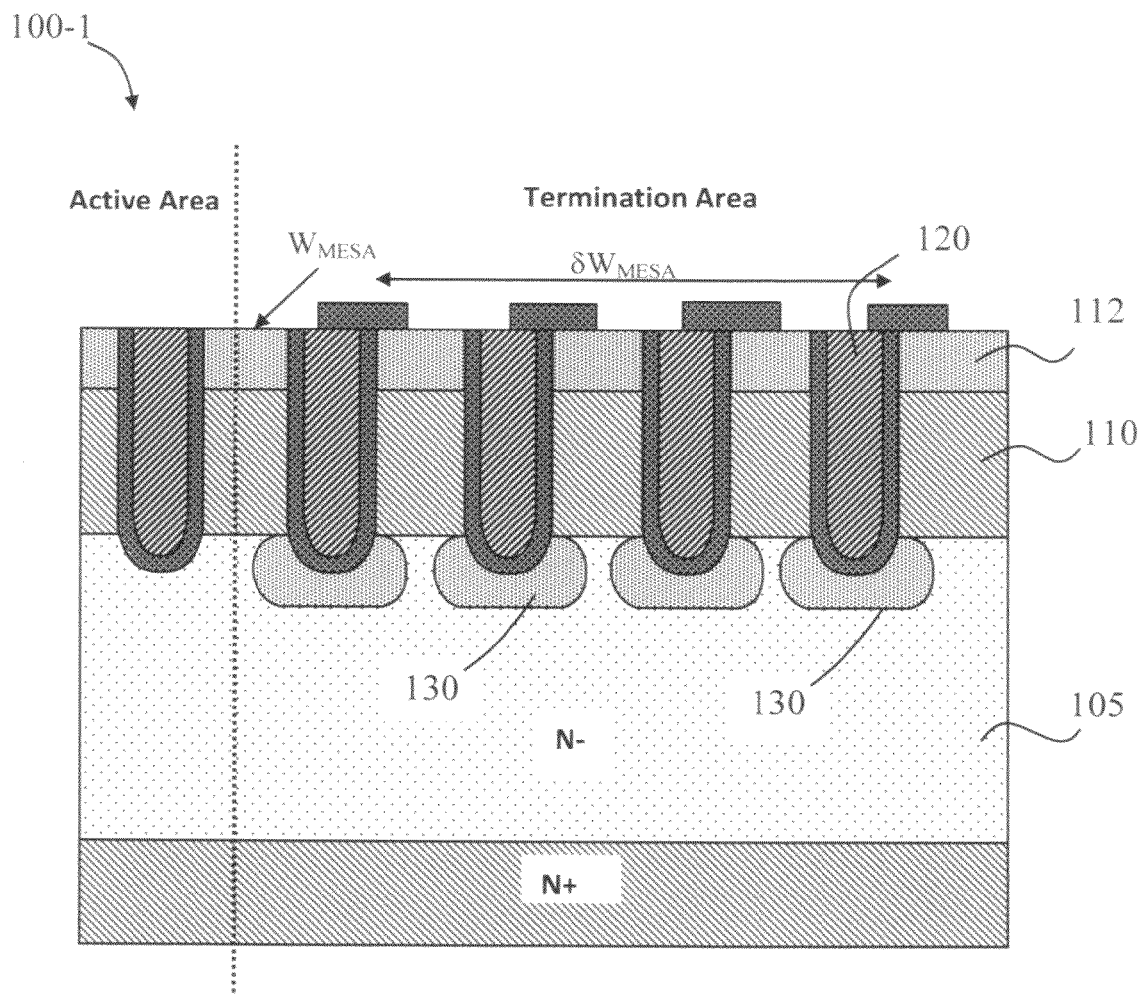
FIG. 2B is a cross sectional view of an alternate configuration of an edge termination with buried guard rings, in which the trench poly electrodes are not left floating, but connected to the adjacent outer mesa P region instead.

FIG. 2B is a cross sectional view of an alternate edge termination 100-1, in which the trench polysilicon electrodes are not left floating as shown in FIG. 2A, but connected to the adjacent outer mesa P region instead through a conductive connector formed between the top surface of the trench polysilicon electrodes and the adjacent P region. This is done in order to turn off the parasitic PMOS formed in the edge termination.

Figure 3:
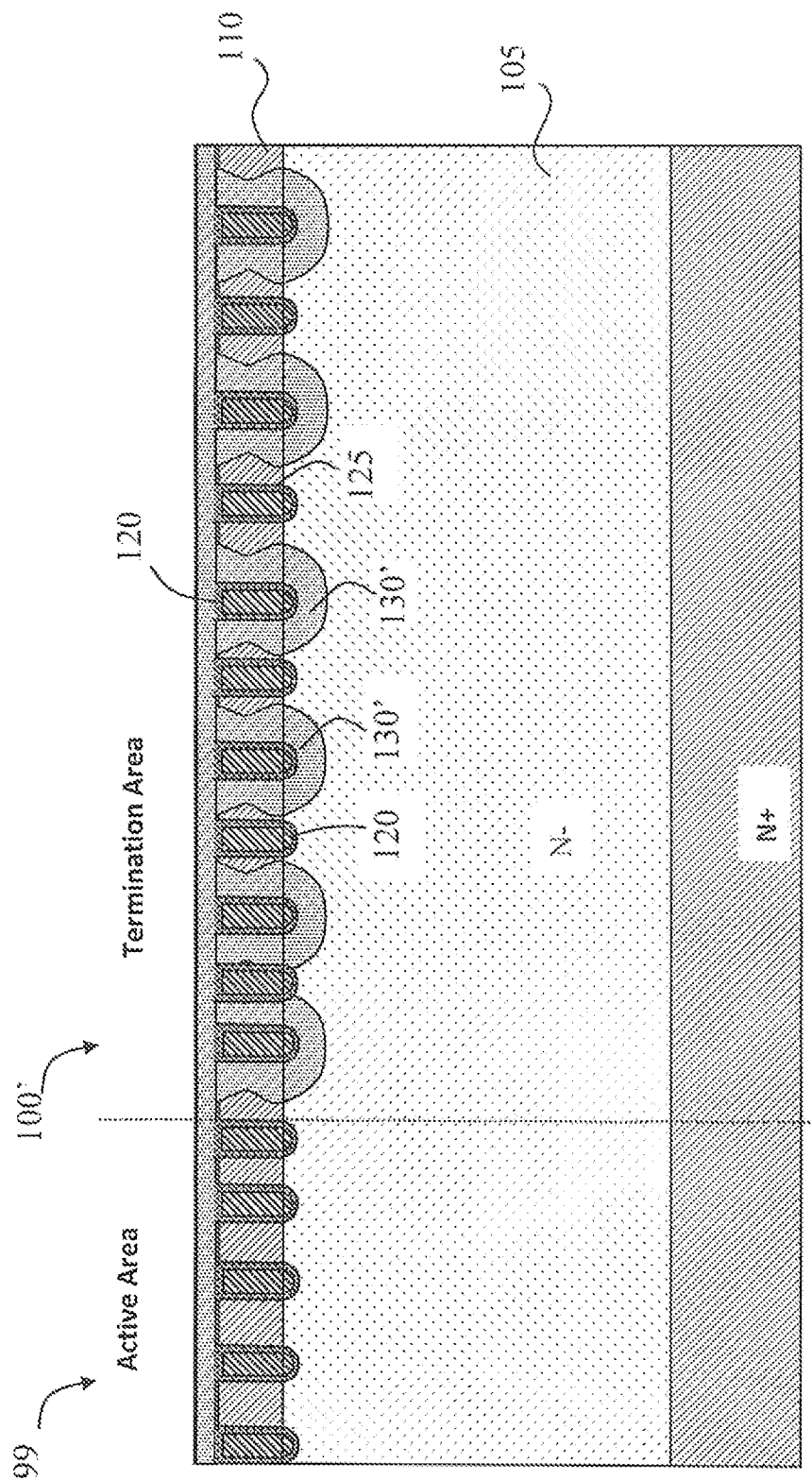
FIG. 3 is a cross sectional view for illustrating the configuration of another edge termination with buried guard rings formed with an alternate configuration as an alternative embodiment of this invention.

FIG. 3 is a cross sectional view for illustrating the configuration of another edge termination 100' with buried guard rings formed with an alternate configuration as an alternative embodiment of this invention. Like the edge termination shown in FIG. 2, the buried guard rings are required for a high voltage (HV) device that has a heavily doped N region 110 formed on a lightly doped N-type substrate 105. The edge termination 100' is formed next to an active cell area 99 and the edge termination 100' includes a plurality of edge termination trenches 120 lined with a dielectric layer 125 on the sidewalls and bottom surface of the trenches and filled with a conductive material. The buried guard rings are formed as doped region 130' surrounding alternating trenches 120, i.e., two trenches surrounded by doped regions 130' separated by an intermediate trench not surrounded by the doped region 130'. Alternating buried guard ring configuration is to prevent the P type doped region of the guard rings 130' along the sidewalls of the adjacent trenches from electrically short that significantly reduces the maximum breakdown voltage sustainable by the guard rings. When the guard rings are electrically shorted through the surface P region and the sidewall P skin, they will be unable to develop voltage between them. So, the voltage drop between adjacent guard rings will be significantly lower than the JFET pinch off voltage, thereby reducing the overall voltage blocking capability of the edge termination. The guard rings doped on alternating trenches is especially required when the mesa doping is light. Termination trenches with no buried guard rings do not have P type doped regions along sidewall. As such, high voltage sustainable by the buried guard rings formed as doped regions 130' surrounding the trenches 120 in the edge termination is achieved and limited only by the pinch-off between the guard rings.

In FIGS. 2A, 3B and FIG. 3 above, as a preferred embodiment, the semiconductor power device of this invention comprises the plurality of termination trenches are formed to have a depth opened into the semiconductor substrate ranging from 2 to 8 microns. In another embodiment, the edge termination area has a width ranging from 70 to 250 microns to form between 5 to 25 termination trenches in the edge termination area.

Figure 4A:
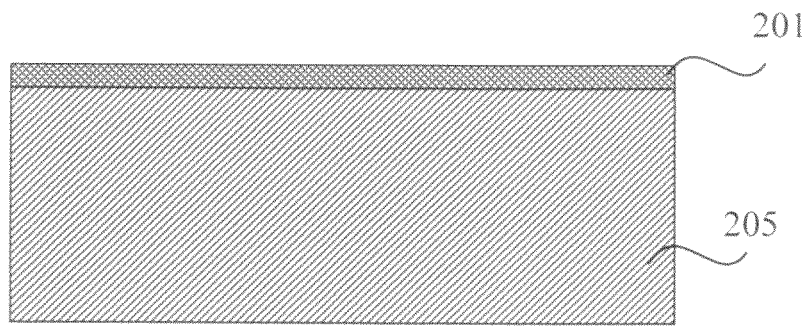
FIGS. 4A-4N are cross sectional views illustrating a process for forming an edge termination with buried guard rings of the type shown in FIG. 2.
Figure 4B:
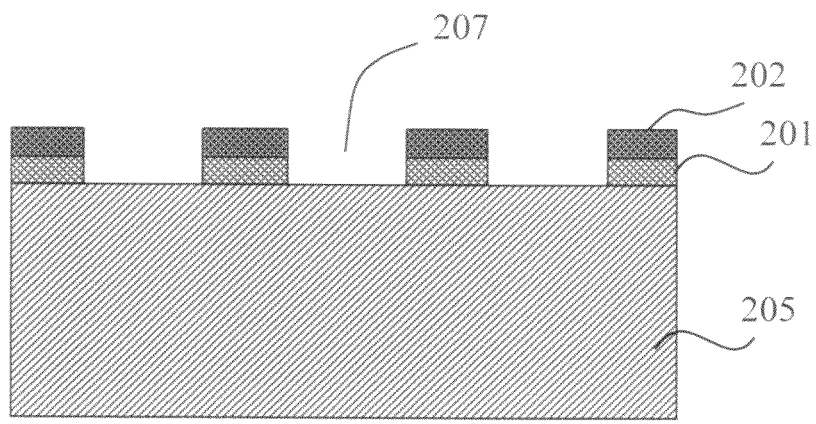
Figure 4C:
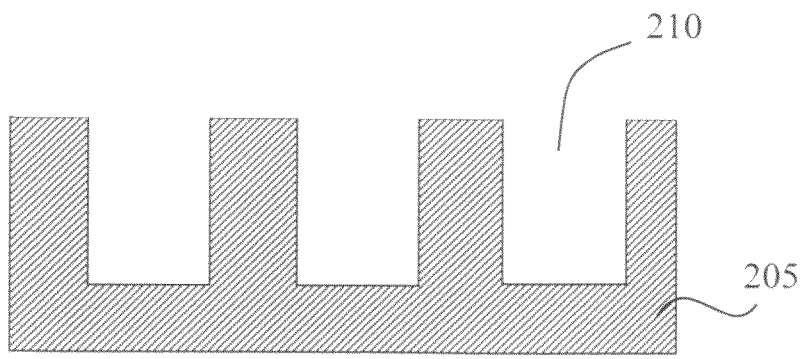
Figure 4D:
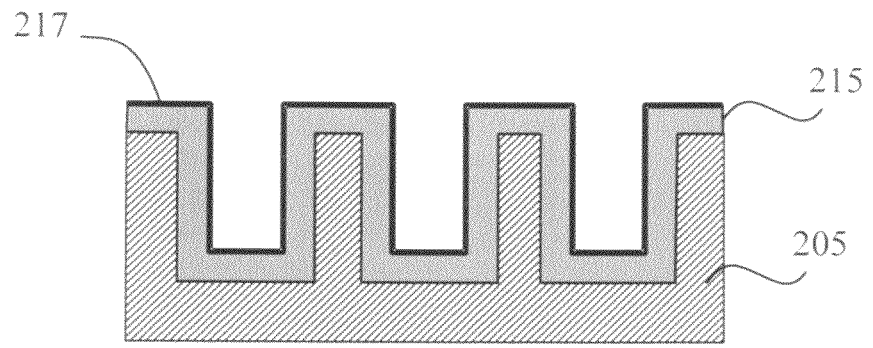
Figure 4E:
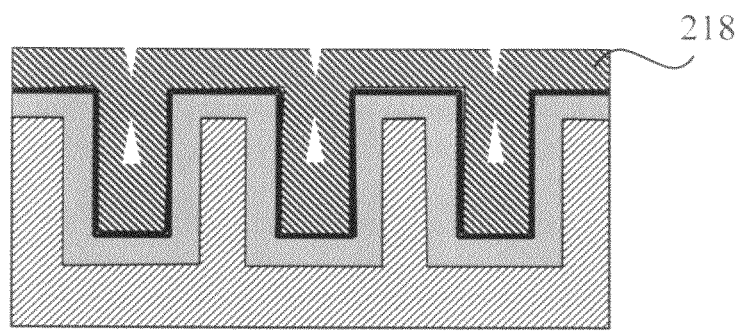
Figure 4F:
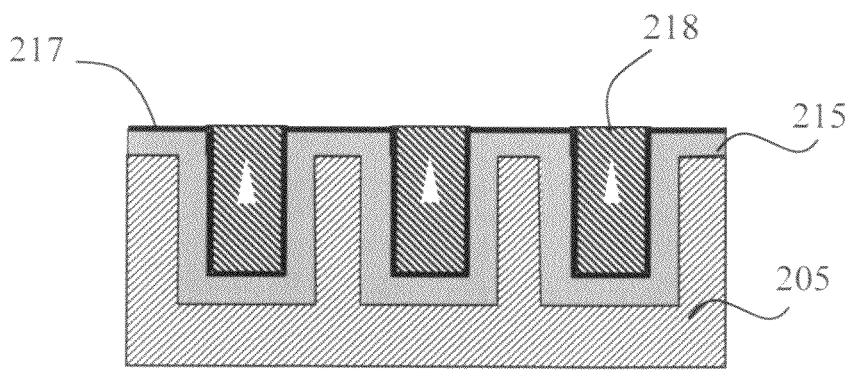
Figure 4G:
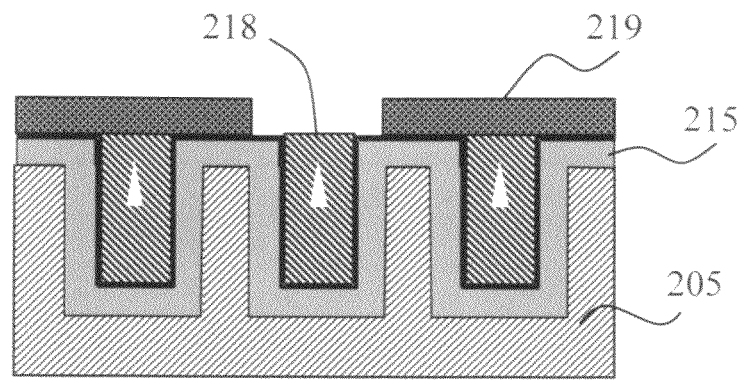
Figure 4H:
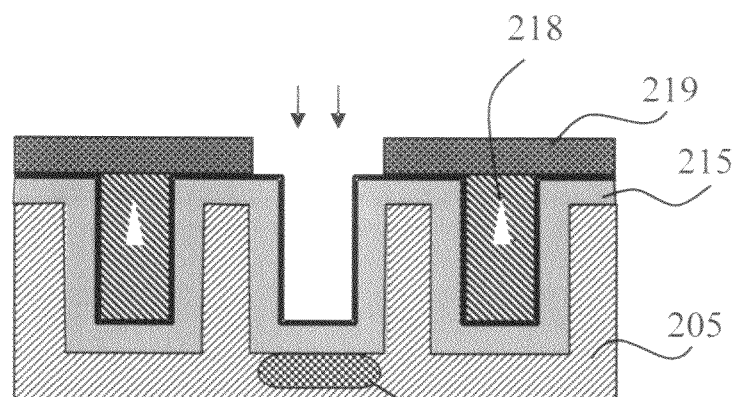
Figure 4I:
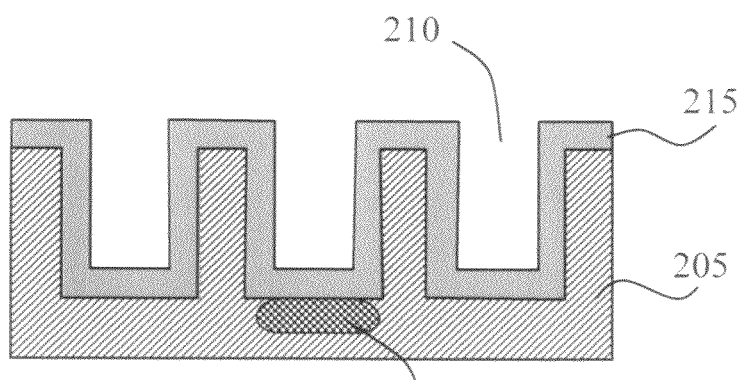
Figure 4J:
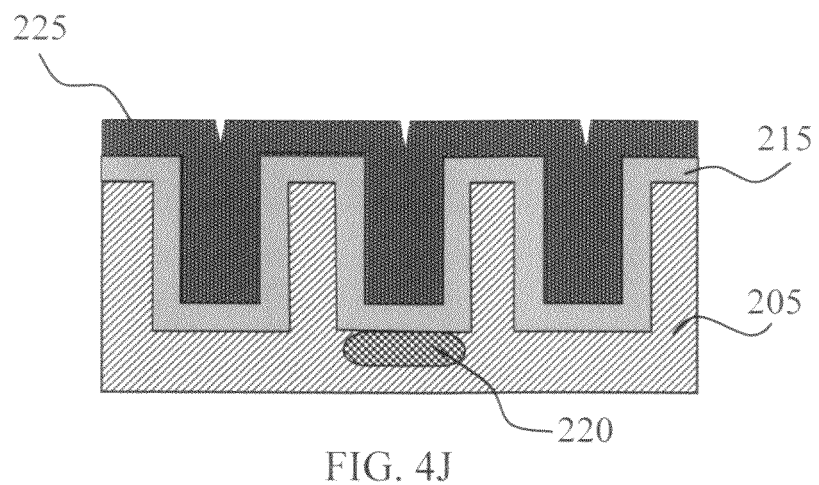
Figure 4K:
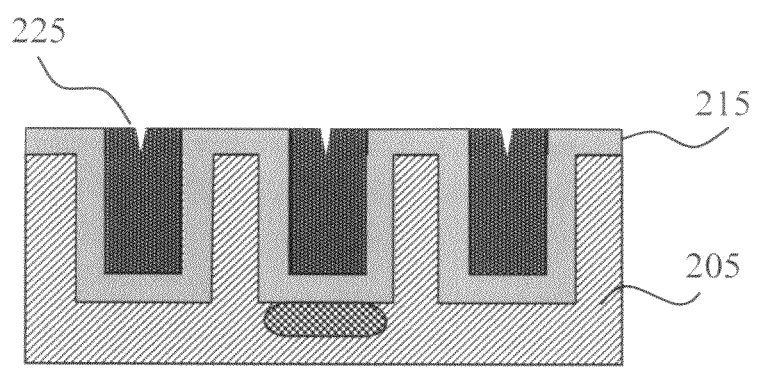
Figure 4L:
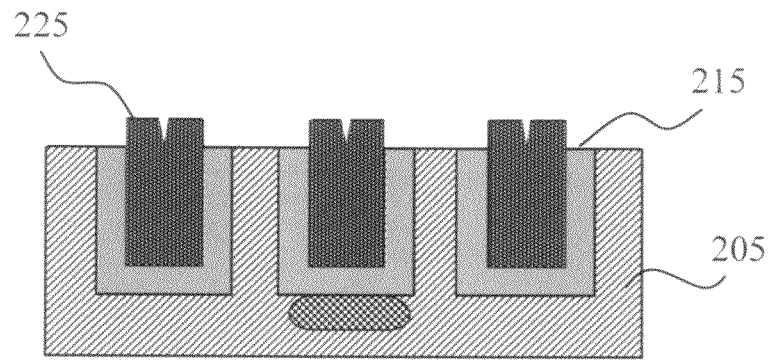
Figure 4M:
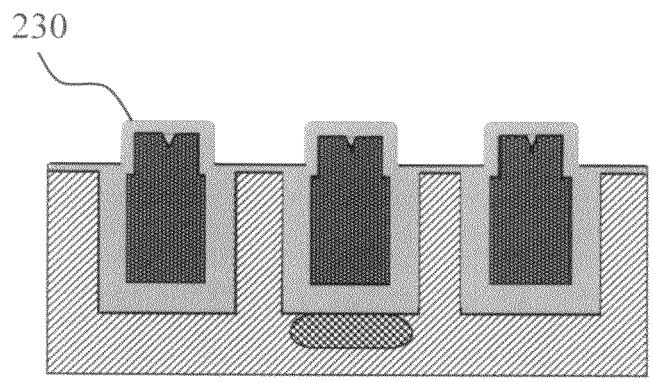
Figure 4N:
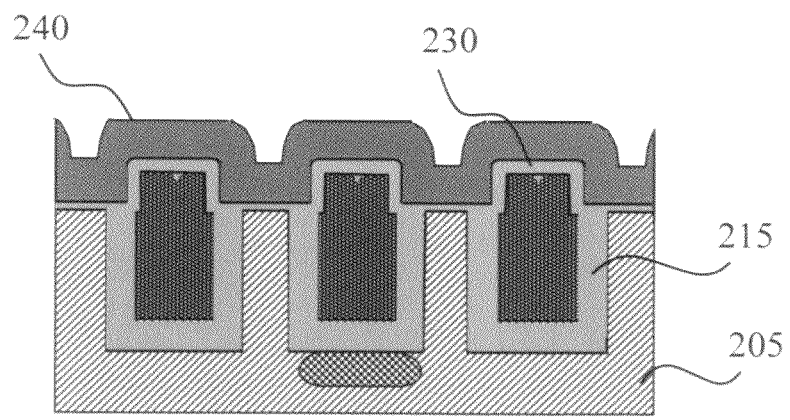

FIGS. 4A to 4N are cross sectional views to illustrate a process for manufacturing an edge termination with buried guard rings as of the type shown in FIG. 2. The manufacturing processes start with an N type substrate 205 covered by a hard mask 201 as shown in FIG. 4A, and a trench mask 202, which can be a photoresist mask, is formed and patterned on top of the hard mask layer 201 (FIG. 4B) to form a plurality of the openings 207 on the hard mask 201. The trench mask 202 is then removed followed by the etching of the substrate 205 through the openings 207 of the hard mask 201 forming termination trenches 210 with a trench depth of about 5 to 8 um. The hard mask 201 is then removed (FIG. 4C). In FIG. 4D, a liner oxide layer 215 is formed on the sidewalls and bottom of each trench 210 followed by depositing a nitride layer 217 on top of the liner oxide layer 215. The oxide layer 215 can be formed by applying a thermal oxidation or chemical vapor deposition (CVD). In FIG. 4E, an oxide 218 is filled into the termination trenches regardless of voids formation inside the trench as long as they are below nitride layer surface 217 due to trench profile. The deposition of oxide 218 can be done by applying a CVD process. The top portion of the oxide layer 218 is removed and stopped at the nitride layer 217 by applying a chemical mechanical planarization (CMP) process (FIG. 4F). In FIG. 4G, an implant mask 219 is applied followed by the removal of the oxide layer 218 by wet/dry etch process from the termination trenches 210 not covered by the implant mask with the oxide etch stopped on the nitride layer 217. P type implantation is then performed to form the buried guard ring regions 220 in the substrate 205 at the bottom of the termination trenches 210 with the oxide layer 218 etched off (FIG. 4H). In FIG. 4I, the implant mask 219 is removed. The remaining oxide layer 218 and the nitride layer 217 are also removed from all the termination trenches 210. In FIG. 4J, a first conductive material 225, such as polysilicon, is deposited into the termination trenches 210 followed by etching back of the first conductive material 225 with an end-point at the surface of the oxide 215 (FIG. 4K). The first conductive material can be referred to as a source poly and will be grounded to the source electrode of the device. Alternatively, the conductive material 225 can be etched back with the end-point at the surface of the substrate 205 or even recessed under the surface of the substrate 205. The oxide 215 is then etched back to remove the oxide layer 215 from the top surface of the silicon substrate 205 (FIG. 4L). In FIGS. 4M-4N, a thermal oxide layer 230 is grown on top of the conductive material 225 and the substrate 205 followed by a deposition of a second conductive material 240, such as polysilicon, on top of the oxide layer 230. The second conductive material 240 maybe referred to as a gate poly and will be connected to the gate electrode of the device.

Figure 5A:
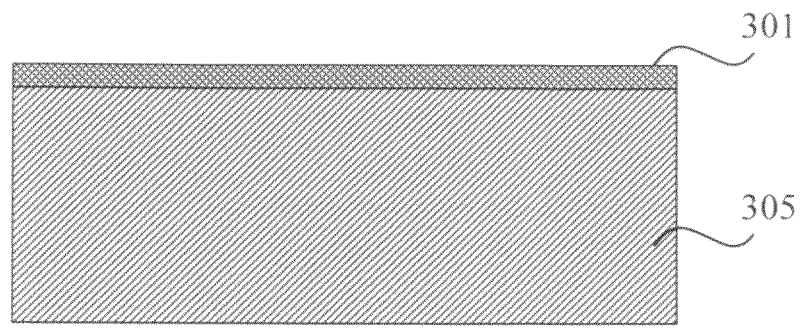
FIGS. 5A-5I are cross sectional views illustrating another process for forming an edge termination with buried guard rings of the type shown in FIG. 2.
Figure 5B:
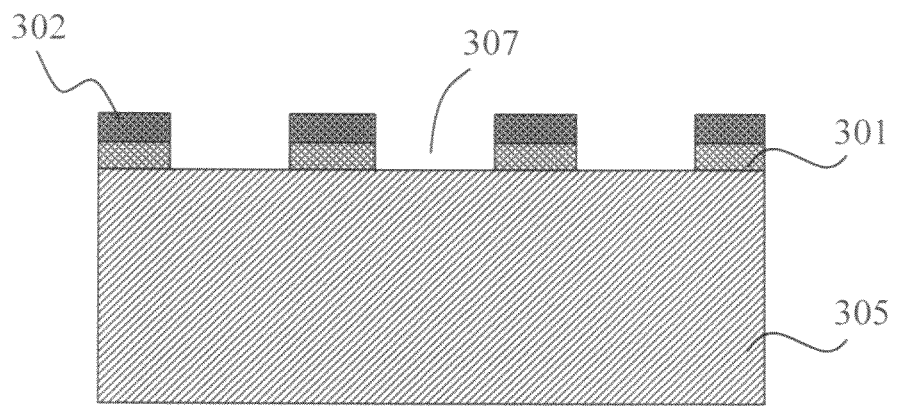
Figure 5C:
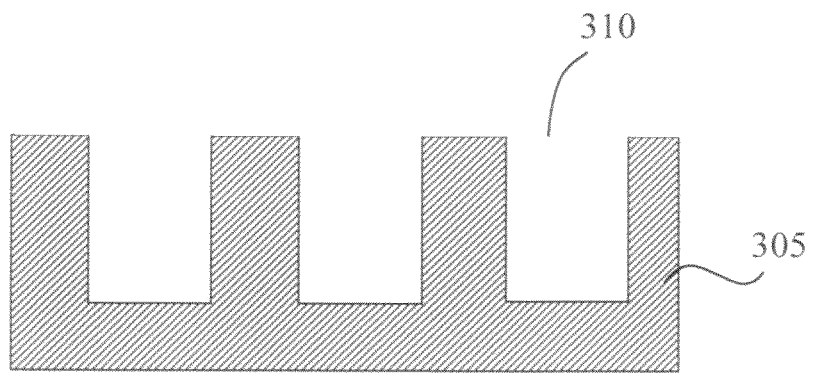
Figure 5D:
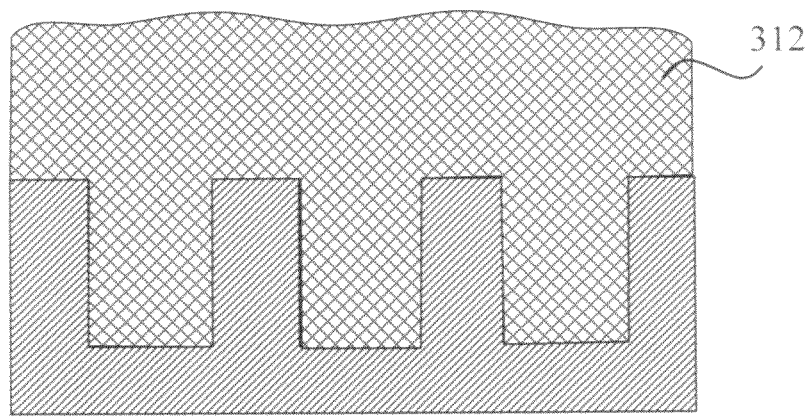
Figure 5E:
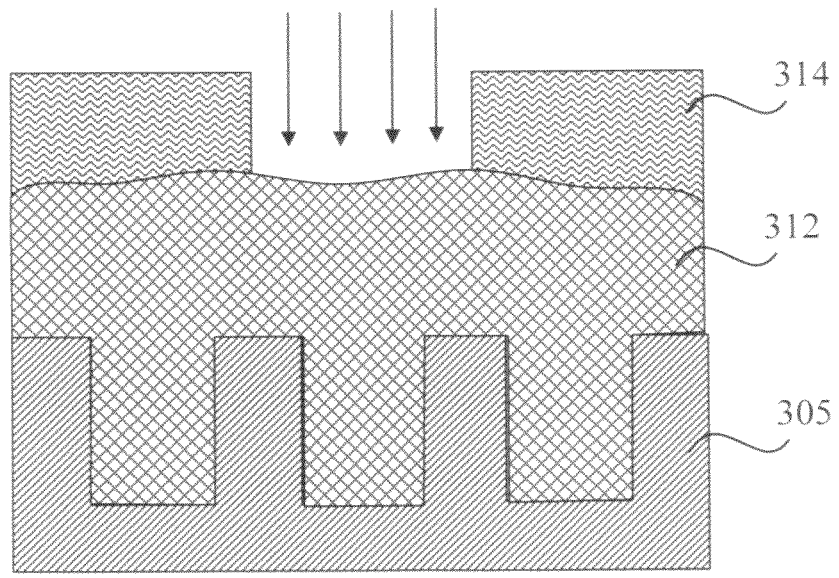
Figure 5F:
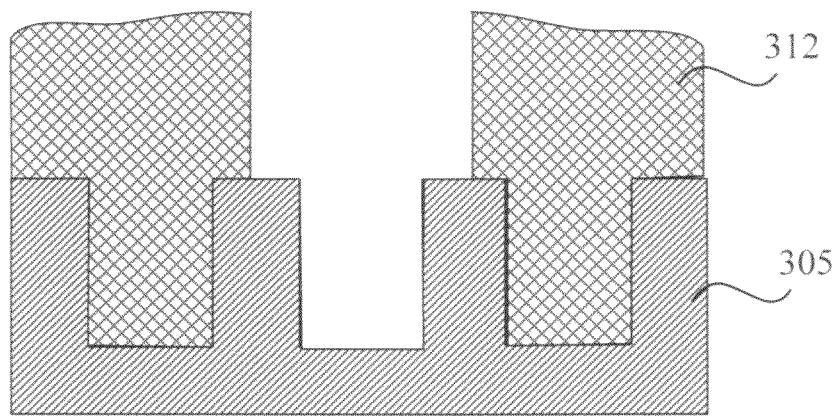
Figure 5G:
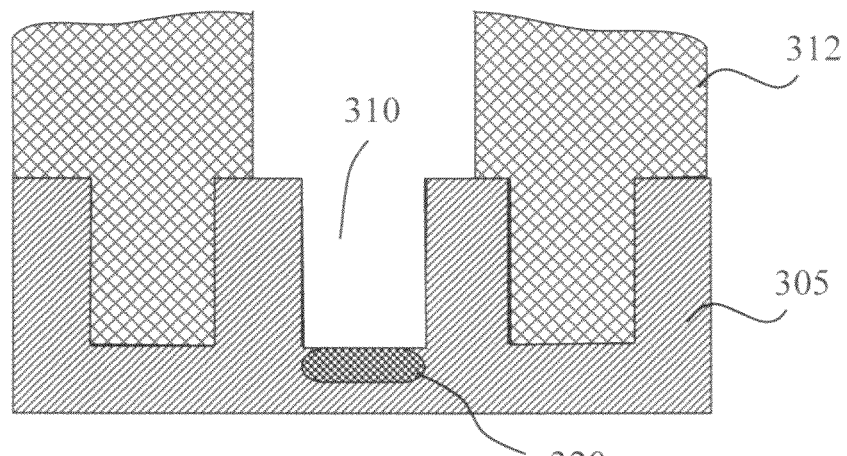
Figure 5H:
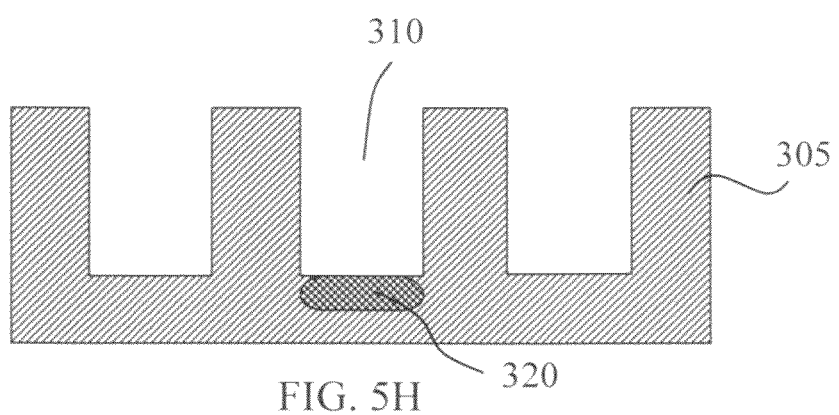
Figure 5I:
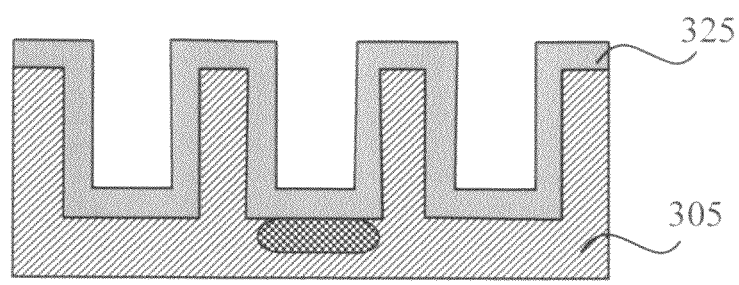

FIGS. 5A-5I are cross sectional views to illustrate another process for manufacturing an edge termination with buried guard rings of the type shown in FIG. 2. The manufacturing processes start with an N type substrate 305 covered by a hard mask 301 as shown in FIG. 5A, and a trench mask 302 is formed and patterned on top of the hard mask 301 (FIG. 5B)

to form a plurality of the openings 307 in the hard mask 301. The trench mask 302 is then removed followed by the etching of the substrate 305 through the openings 307 of the hard mask 301 forming plurality of termination trenches 310. The hard mask 301 is then removed (FIG. 5C). In FIG. 5D, a photoresist material 312 is formed on top of the substrate 305 covering the top surface of the substrate 305 and filling the termination trenches 310. In FIG. 5E, an implant mask 314 is applied over the photoresist layer 312 followed by a photo-lithographic exposure over the implant mask 314 to remove the photo resist layer 312 from the exposed termination trenches 310 (FIG. 5F). In FIG. 5G, a P type implantation is carried out through the opened termination trenches 310 to form the buried guard rings doped regions 320 in the substrate 305 below the bottom surface of the termination trenches 310 (FIG. 5H). In FIG. 5I, a liner oxide layer 325 by applying a thermal oxidation or chemical vapor deposition (CVD) process is formed at the sidewalls and bottom of the termination trenches 310. The manufacturing continues by applying the same processes as that described in FIGS. 4J to 4N to complete the manufacturing processes of an edge termination with the buried guard rings of the type shown in FIG. 2.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A semiconductor power device disposed in a semiconductor substrate having an active cell area and an edge termination area wherein:

the edge termination area comprises a plurality of termination trenches surrounded by a heavily doped region of the first conductivity supported by a lightly doped layer of the first conductivity type, wherein the termination trenches are lined with a dielectric layer and filled with a conductive material therein; and doped regions of the second conductivity type completely surrounding alternating trenches of the termination trenches separated by one of the termination trenches disposed between the alternating trenches as a separating termination trench wherein each of the separating termination trenches is not completely surrounded by the doped region of the second conductivity type in the semiconductor substrate.

2. The semiconductor power device of claim 1 wherein:
the doped regions completely surrounding the alternating termination trenches extends below the heavily doped region of the first conductivity into the lightly doped layer of the first conductivity type.

3. The semiconductor power device of claim 1 wherein:
the plurality of termination trenches have a spacing between two adjacent termination trenches wherein the spacing is smaller near the active area and the spacing is increased for the adjacent trenches disposed farther away from the active cell area.

4. The semiconductor power device of claim 1 wherein:
the plurality of termination trenches have a depth in the semiconductor substrate ranging from 2 to 8 microns.

5. The semiconductor power device of claim 1 wherein:
the edge termination area has a width ranging from 70 to 250 microns to form between 5 to 25 termination trenches in the edge termination area.

* * * * *